(12) United States Patent
Lopez

(10) Patent No.: US 12,342,869 B2
(45) Date of Patent: Jul. 1, 2025

(54) APPARATUS FOR AN AEROSOL GENERATING DEVICE

(71) Applicant: Nicoventures Trading Limited, London (GB)

(72) Inventor: Victor Clavez Lopez, London (GB)

(73) Assignee: NICOVENTURES TRADING LIMITED, London (GB)

( * ) Notice: Subject to any disclaimer, the term of this patent is extended or adjusted under 35 U.S.C. 154(b) by 591 days.

(21) Appl. No.: 17/596,283

(22) PCT Filed: Jun. 25, 2020

(86) PCT No.: PCT/GB2020/051542
§ 371 (c)(1),
(2) Date: Dec. 7, 2021

(87) PCT Pub. No.: WO2020/260883
PCT Pub. Date: Dec. 30, 2020

(65) Prior Publication Data
US 2022/0225680 A1 Jul. 21, 2022

(30) Foreign Application Priority Data
Jun. 28, 2019 (GB) ..................... 1909385

(51) Int. Cl.
*H05B 6/06* (2006.01)
*A24D 1/20* (2020.01)
(Continued)

(52) U.S. Cl.
CPC .............. *A24F 40/465* (2020.01); *A24D 1/20* (2020.01); *A24F 40/20* (2020.01);
(Continued)

(58) Field of Classification Search
CPC ......... A24D 1/20; A24F 40/20; A24F 40/465; A24F 40/40; A24F 40/46; A24F 40/50;
(Continued)

(56) References Cited

U.S. PATENT DOCUMENTS 10,930,532 B2 * 2/2021 White ............... H01L 21/67144
2005/0270136 A1 12/2005 Tolle et al.

FOREIGN PATENT DOCUMENTS

CN 202364801 U 8/2012
CN 207135418 3/2018
(Continued)

OTHER PUBLICATIONS

Translation of JP06325949A, "Structure of Electromagnetic Circuit", Nov. 25, 1994, by ProQuest (Year: 1994).*
(Continued)

*Primary Examiner* — Quang T Van
(74) *Attorney, Agent, or Firm* — BURR & FORMAN LLP

(57) ABSTRACT

An apparatus for a (non-combustible) aerosol generating device is described including: a resonant circuit including one or more inductive elements for inductively heating a susceptor arrangement to heat an aerosol generating material to thereby generate an aerosol, wherein the inductive elements are mounted on a first external surface of a substrate; a switching arrangement for enabling an alternating current to be generated from a voltage supply and flow through one or more of said inductive elements to cause inductive heating of the susceptor arrangement, wherein the switching arrangement includes a plurality of transistors mounted to a second external surface of the substrate; and a heat sink, wherein the inductive elements of the resonant circuit and the transistors of the switching arrangement are thermally connected to the heat sink.

20 Claims, 13 Drawing Sheets

(51) Int. Cl.
  *A24F 40/20* (2020.01)
  *A24F 40/465* (2020.01)
  *H02M 7/5387* (2007.01)
  *H05B 6/10* (2006.01)
  *H05K 1/18* (2006.01)
  *H05K 7/20* (2006.01)

(52) U.S. Cl.
  CPC ............ *H02M 7/5387* (2013.01); *H05B 6/06* (2013.01); *H05B 6/105* (2013.01); *H05K 1/181* (2013.01); *H05K 7/209* (2013.01)

(58) Field of Classification Search
  CPC ... A24F 40/57; H02M 7/4815; H02M 7/5387; H05B 6/06; H05B 6/105; H05B 6/108; H05B 1/0202; H05K 1/0207; H05K 1/0298; H05K 1/181; H05K 7/209; Y02B 70/10
  USPC ....... 219/618, 600, 606, 607, 621, 628, 633, 219/634, 660, 676, 260, 263, 264, 265, 219/267, 269
  See application file for complete search history.

(56) References Cited

FOREIGN PATENT DOCUMENTS

| | | |
|---|---|---|
| CN | 108041689 A | 5/2018 |
| JP | 61067983 A | 4/1986 |
| JP | H06325949 A | 11/1994 |
| JP | 2014511175 A | 5/2014 |
| JP | 7406575 B2 | 12/2023 |
| WO | WO 2018/178114 A2 | 10/2018 |

OTHER PUBLICATIONS

International Search Report and Written Opinion, International Application No. PCT/GB2020/051542, mailing date Sep. 28, 2020, 16 pages.

Office Action (with English Translation) issued in corresponding Japanese Patent Application No. 2023-196491 mailed Dec. 24, 2024, all pages cited in its entirety.

* cited by examiner

APPARATUS FOR AN AEROSOL GENERATING DEVICE

PRIORITY CLAIM

The present application is a National Phase entry of PCT Application No. PCT/GB2020/051542, filed Jun. 25, 2020, which claims priority from Great Britain Application No. 1909385.5, filed Jun. 28, 2019, each of which is hereby fully incorporated herein by reference.

TECHNICAL FIELD

The present specification relates to an apparatus for an aerosol generating device.

BACKGROUND

Smoking articles, such as cigarettes, cigars and the like burn tobacco during use to create tobacco smoke. Attempts have been made to provide alternatives to these articles by creating products that release compounds without combusting. For example, tobacco heating devices heat an aerosol generating substrate such as tobacco to form an aerosol by heating, but not burning, the substrate.

SUMMARY

In a first aspect, this specification describes an apparatus for an aerosol generating device comprising: a resonant circuit (such as an LC resonant circuit) comprising one or more inductive elements (e.g. one or more inductive coils) for inductively heating a susceptor arrangement to heat an aerosol generating material to thereby generate an aerosol, wherein the inductive elements are mounted on a first external surface of a substrate; a switching arrangement (such as a bridge circuit) for enabling an alternating current to be generated from a voltage supply (e.g. a DC voltage supply) and flow through one or more of said inductive elements to cause inductive heating of the susceptor arrangement, wherein the switching arrangement comprises a plurality of transistors mounted to a second external surface of the substrate; and a heat sink, wherein the inductive elements of the resonant circuit and the transistors of the switching arrangement are thermally connected to the heat sink.

The transistors of the switching arrangement may be implemented using one or more flat no-lead packages (such as dual-flat no-lead packages, quad flat no-lead packages or similar technologies).

The heat sink may be formed, at least in part, on the first external surface of the substrate. Alternatively, or in addition, the heat sink is formed, at least in part, on the second external surface of the substrate.

The heat sink may be a copper heat reservoir.

The heat sink may be a ground plane.

The substrate may be a printed circuit board, such as a multi-layered printed circuit board. The heat sink may, for example, be formed, at least in part, on an internal layer of the multi-layer printed circuit board.

The first external surface of the substrate may be a top layer of a multi-layer printed circuit board and the second external surface of the substrate may be a bottom layer of the multi-layer printed circuit board.

The resonant circuit may further comprise a capacitor.

The switching arrangement may be configured to provide an impulse generation circuit for applying an impulse to the resonant circuit, wherein the applied impulse induces an impulse response.

In a second aspect, this specification describes a non-combustible aerosol generating device comprising an apparatus as described above with reference to the first aspect. The said apparatus may comprise a tobacco heating system. The aerosol generating device may be configured to receive a removable article comprising an aerosol generating material. The aerosol generating material may, for example, comprise an aerosol generating substrate and an aerosol forming material. The removable article may include the said susceptor arrangement.

In a third aspect, this specification describes a kit of parts comprising an article for use in a non-combustible aerosol generating system, wherein the non-combustible aerosol generating system comprises an apparatus including any of the features of the first aspect described above or an aerosol generating device including any of the features of the second aspect described above. The article may, for example, be a removable article comprising an aerosol generating material.

BRIEF DESCRIPTION OF THE DRAWINGS

Example embodiments will now be described, by way of example only, with reference to the following schematic drawings, in which.

DETAILED DESCRIPTION OF THE DRAWINGS

Figure 1:
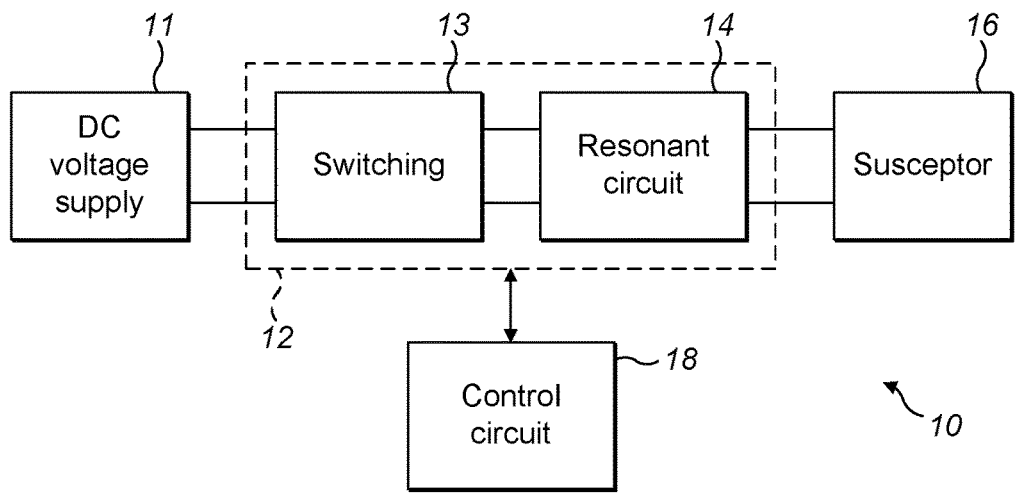
FIG. 1 is a block diagram of a system in accordance with an example embodiment.

As used herein, the term "delivery system" is intended to encompass systems that deliver a substance to a user, and includes:

combustible aerosol provision systems, such as cigarettes, cigarillos, cigars, and tobacco for pipes or for roll-your-own or for make-your-own cigarettes (whether based on tobacco, tobacco derivatives, expanded tobacco, reconstituted tobacco, tobacco substitutes or other smokable material);

non-combustible aerosol provision systems that release compounds from an aerosolizable material without combusting the aerosolizable material, such as electronic cigarettes, tobacco heating products, and hybrid systems to generate aerosol using a combination of aerosolizable materials;

articles comprising aerosolizable material and configured to be used in one of these non-combustible aerosol provision systems; and aerosol-free delivery systems, such as lozenges, gums, patches, articles comprising inhalable powders, and smokeless tobacco products such as snus and snuff, which deliver a material to a user without forming an aerosol, wherein the material may or may not comprise nicotine.

According to the present disclosure, a "combustible" aerosol provision system is one where a constituent aerosolizable material of the aerosol provision system (or component thereof) is combusted or burned in order to facilitate delivery to a user.

According to the present disclosure, a "non-combustible" aerosol provision system is one where a constituent aerosolizable material of the aerosol provision system (or component thereof) is not combusted or burned in order to facilitate delivery to a user.

In embodiments described herein, the delivery system is a non-combustible aerosol provision system, such as a powered non-combustible aerosol provision system.

In one embodiment, the non-combustible aerosol provision system is an electronic cigarette, also known as a vaping device or electronic nicotine delivery system (END), although it is noted that the presence of nicotine in the aerosolizable material is not a requirement.

In one embodiment, the non-combustible aerosol provision system is a tobacco heating system, also known as a heat-not-burn system.

In one embodiment, the non-combustible aerosol provision system is a hybrid system to generate aerosol using a combination of aerosolizable materials, one or a plurality of which may be heated. Each of the aerosolizable materials may be, for example, in the form of a solid, liquid or gel and may or may not contain nicotine. In one embodiment, the hybrid system comprises a liquid or gel aerosolizable material and a solid aerosolizable material. The solid aerosolizable material may comprise, for example, tobacco or a non-tobacco product.

Typically, the non-combustible aerosol provision system may comprise a non-combustible aerosol provision device and an article for use with the non-combustible aerosol provision system. However, it is envisaged that articles which themselves comprise a means for powering an aerosol generating component may themselves form the non-combustible aerosol provision system.

In one embodiment, the non-combustible aerosol provision device may comprise a power source and a controller. The power source may be an electric power source or an exothermic power source. In one embodiment, the exothermic power source comprises a carbon substrate which may be energized so as to distribute power in the form of heat to an aerosolizable material or heat transfer material in proximity to the exothermic power source. In one embodiment, the power source, such as an exothermic power source, is provided in the article so as to form the non-combustible aerosol provision.

In one embodiment, the article for use with the non-combustible aerosol provision device may comprise an aerosolizable material, an aerosol generating component, an aerosol generating area, a mouthpiece, and/or an area for receiving aerosolizable material.

In one embodiment, the aerosol generating component is a heater capable of interacting with the aerosolizable material so as to release one or more volatiles from the aerosolizable material to form an aerosol. In one embodiment, the aerosol generating component is capable of generating an aerosol from the aerosolizable material without heating. For example, the aerosol generating component may be capable of generating an aerosol from the aerosolizable material without applying heat thereto, for example via one or more of vibrational, mechanical, pressurization or electrostatic means.

In one embodiment, the aerosolizable material may comprise an active material, an aerosol forming material and optionally one or more functional materials. The active material may comprise nicotine (optionally contained in tobacco or a tobacco derivative) or one or more other non-olfactory physiologically active materials. A non-olfactory physiologically active material is a material which is included in the aerosolizable material in order to achieve a physiological response other than olfactory perception.

The aerosol forming material may comprise one or more of glycerine, glycerol, propylene glycol, diethylene glycol, triethylene glycol, tetraethylene glycol, 1,3-butylene glycol, erythritol, meso-Erythritol, ethyl vanillate, ethyl laurate, a diethyl suberate, triethyl citrate, triacetin, a diacetin mixture, benzyl benzoate, benzyl phenyl acetate, tributyrin, lauryl acetate, lauric acid, myristic acid, and propylene carbonate.

The one or more functional materials may comprise one or more of flavors, carriers, pH regulators, stabilizers, and/or antioxidants.

In one embodiment, the article for use with the non-combustible aerosol provision device may comprise aerosolizable material or an area for receiving aerosolizable material. In one embodiment, the article for use with the non-combustible aerosol provision device may comprise a mouthpiece. The area for receiving aerosolizable material may be a storage area for storing aerosolizable material. For example, the storage area may be a reservoir. In one embodiment, the area for receiving aerosolizable material may be separate from, or combined with, an aerosol generating area.

Aerosolizable material, which also may be referred to herein as aerosol generating material, is material that is capable of generating aerosol, for example when heated, irradiated or energized in any other way. Aerosolizable material may, for example, be in the form of a solid, liquid or gel which may or may not contain nicotine and/or flavorants. In some embodiments, the aerosolizable material may comprise an "amorphous solid", which may alternatively be referred to as a "monolithic solid" (i.e. non-fibrous). In some embodiments, the amorphous solid may be a dried gel. The amorphous solid is a solid material that may retain some fluid, such as liquid, within it.

The aerosolizable material may be present on a substrate. The substrate may, for example, be or comprise paper, card, paperboard, cardboard, reconstituted aerosolizable material, a plastics material, a ceramic material, a composite material, glass, a metal, or a metal alloy.

FIG. 1 is a block diagram of a system, indicated generally by the reference numeral 10, in accordance with an example embodiment. System 10 comprises a power source in the form of a direct current (DC) voltage supply 11, a switching arrangement 13, a resonant circuit 14, a susceptor arrangement 16, and a control circuit 18. The switching arrangement 13 and the resonant circuit 14 may be coupled together in an inductive heating arrangement 12.

The resonant circuit 14 may comprise a capacitor and one or more inductive elements for inductively heating the susceptor arrangement 16 to heat an aerosol generating material. Heating the aerosol generating material may thereby generate an aerosol.

The switching arrangement 13 may enable an alternating current to be generated from the DC voltage supply 11. The alternating current may flow through the one or more inductive elements and may cause the heating of the susceptor arrangement. The switching arrangement may comprise a plurality of transistors. Example DC-AC converters include H-bridge or inverter circuits, examples of which are discussed below. It should be noted that the provision of a DC voltage supply 11 from which a pseudo AC signal is generated is not an essential feature; for example, a controllable AC supply or an AC-AC converter may be provided. Thus, an AC input could be provided (such as from a mains supply or an inverter).

Example arrangements of the switching arrangement 13 and the resonant circuit 14 are discussed in greater detail in FIGS. 5 to 14.

Figure 2:
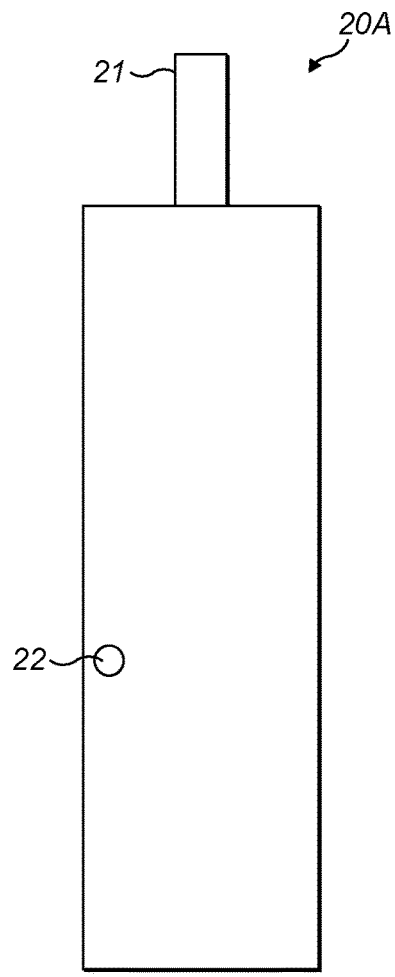
FIG. 2 shows a non-combustible aerosol provision device in accordance with an example embodiment.
Figure 3:
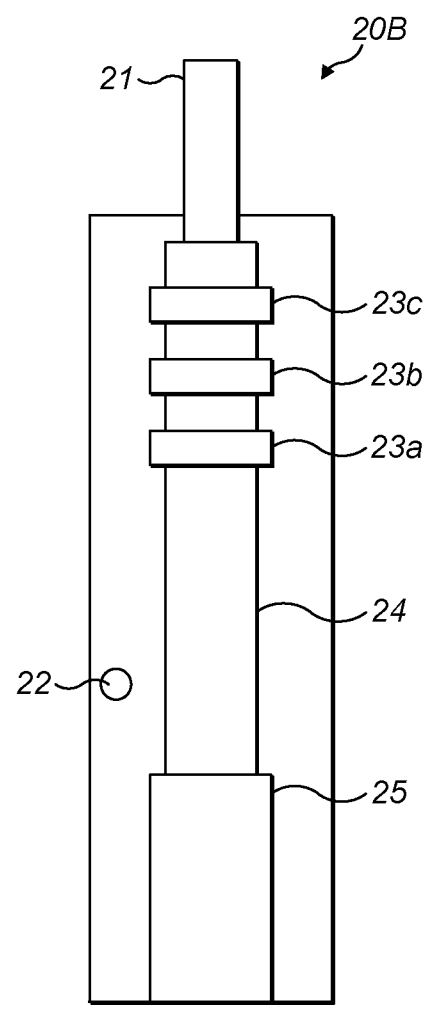
FIG. 3 is a view of a non-combustible aerosol provision device in accordance with an example embodiment.

FIGS. 2 and 3 show a non-combustible aerosol provision device, indicated generally by the reference numeral 20, in accordance with an example embodiment. FIG. 2 is a perspective view of an aerosol provision device 20A with an outer cover. The aerosol provision device 20A may comprise a replaceable article 21 that may be inserted in the aerosol provision device 20A to enable heating of a susceptor comprised within the article 21 (or provided elsewhere). The aerosol provision device 20A may further comprise an activation switch 22 that may be used for switching on or switching off the aerosol provision device 20A. Further elements of the aerosol provision device 20 are illustrated in FIG. 3.

FIG. 3 depicts an aerosol provision device 20B with the outer cover removed. The aerosol generating device 20B comprises the article 21, the activation switch 22, a plurality of inductive elements 23a, 23b, and 23c, and one or more air tube extenders 24 and 25. The one or more air tube extenders 24 and 25 may be optional.

The plurality of inductive elements 23a, 23b, and 23c may each form part of a resonant circuit, such as the resonant circuit 14. The inductive element 23a may comprise a helical inductor coil. In one example, the helical inductor coil is made from Litz wire/cable which is wound in a helical fashion to provide the helical inductor coil. Many alternative inductor formations are possible, such as inductors formed within a printed circuit board. The inductive elements 23b and 23c may be similar to the inductive element 23a. The use of three inductive elements 23a, 23b and 23c is not essential to all example embodiments. Thus, the aerosol generating device 20 may comprise one or more inductive elements.

A susceptor may be provided as part of the article 21. In an example embodiment, when the article 21 is inserted in aerosol generating device, the aerosol generating device 20 may be turned on due to the insertion of the article 21. This may be due to detecting the presence of the article 21 in the aerosol generating device using an appropriate sensor (e.g., a light sensor) or, in cases where the susceptor forms a part of the article 21, by detecting the presence of the susceptor using the resonant circuit 14, for example. When the aerosol generating device 20 is turned on, the inductive elements 23 may cause the article 21 to be inductively heated through the susceptor. In an alternative embodiment, the susceptor may be provided as part of the aerosol generating device 20 (e.g. as part of a holder for receiving the article 21).

Figure 4:
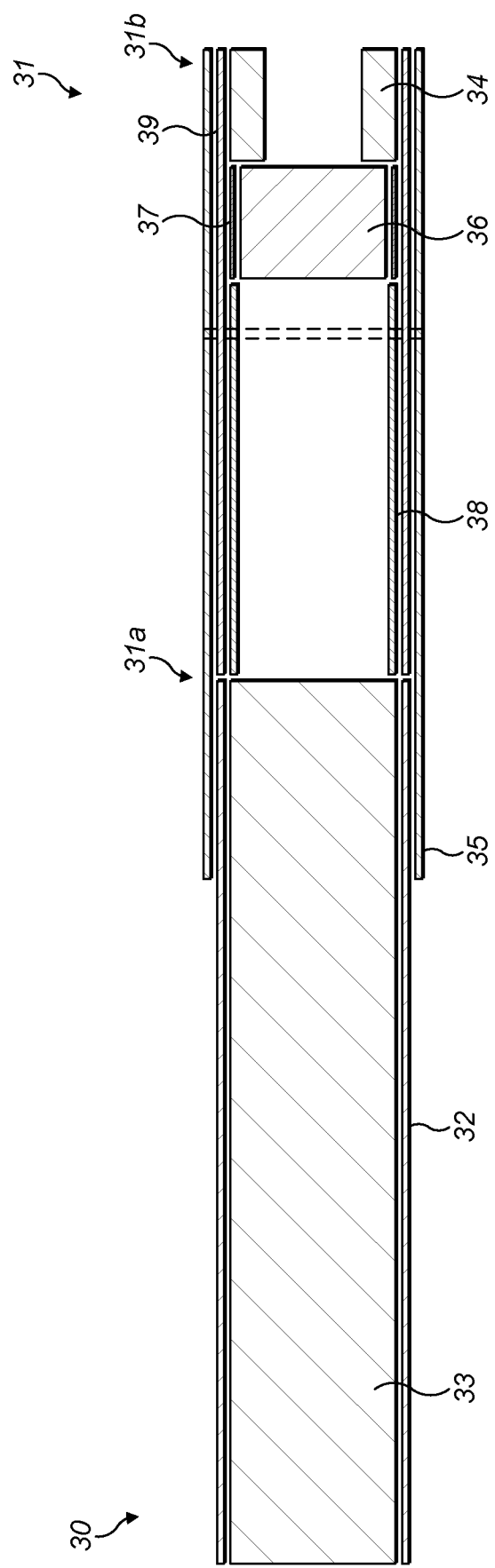
FIG. 4 is a view of an article for use with a non-combustible aerosol provision device in accordance with an example embodiment.

FIG. 4 is a view of an article, indicated generally by the reference numeral 30, for use with a non-combustible aerosol provision device in accordance with an example embodiment. The article 30 is an example of the replaceable article 21 described above with reference to FIGS. 2 and 3.

The article 30 comprises a mouthpiece 31, and a cylindrical rod of aerosol generating material 33, in the present case tobacco material, connected to the mouthpiece 31. The aerosol generating material 33 provides an aerosol when heated, for instance within a non-combustible aerosol generating device, such as the aerosol generating device 20, as described herein. The aerosol generating material 33 is wrapped in a wrapper 32. The wrapper 32 can, for instance, be a paper or paper-backed foil wrapper. The wrapper 32 may be substantially impermeable to air.

In one embodiment, the wrapper 32 comprises aluminum foil. Aluminum foil has been found to be particularly effective at enhancing the formation of aerosol within the aerosol generating material 33. In one example, the aluminum foil has a metal layer having a thickness of about 6 μm. The aluminum foil may have a paper backing. However, in alternative arrangements, the aluminum foil can have other thicknesses, for instance between 4 μm and 16 μm in thickness. The aluminum foil also need not have a paper backing, but could have a backing formed from other materials, for instance to help provide an appropriate tensile strength to the foil, or it could have no backing material. Metallic layers or foils other than aluminum can also be used. Moreover, it is not essential that such metallic layers are provided as part of the article 30; for example, such a metallic layer could be provided as part of the apparatus 20.

The aerosol generating material 33, also referred to herein as an aerosol generating substrate 33, comprises at least one aerosol forming material. In the present example, the aerosol forming material is glycerol. In alternative examples, the aerosol forming material can be another material as described herein or a combination thereof. The aerosol forming material has been found to improve the sensory performance of the article, by helping to transfer compounds such as flavor compounds from the aerosol generating material to the consumer.

As shown in FIG. 4, the mouthpiece 31 of the article 30 comprises an upstream end 31a adjacent to an aerosol generating substrate 33 and a downstream end 31b distal from the aerosol generating substrate 33. The aerosol generating substrate may comprise tobacco, although alternatives are possible.

The mouthpiece 31, in the present example, includes a body of material 36 upstream of a hollow tubular element 34, in this example adjacent to and in an abutting relationship with the hollow tubular element 34. The body of material 36 and hollow tubular element 34 each define a substantially cylindrical overall outer shape and share a common longitudinal axis. The body of material 36 is wrapped in a first plug wrap 37. The first plug wrap 37 may have a basis weight of less than 50 gsm, such as between about 20 gsm and 40 gsm.

In the present example the hollow tubular element 34 is a first hollow tubular element 34 and the mouthpiece includes a second hollow tubular element 38, also referred to as a cooling element, upstream of the first hollow tubular element 34. In the present example, the second hollow tubular element 38 is upstream of, adjacent to and in an abutting relationship with the body of material 36. The body of material 36 and second hollow tubular element 38 each define a substantially cylindrical overall outer shape and share a common longitudinal axis. The second hollow tubular element 38 is formed from a plurality of layers of paper which are parallel wound, with butted seams, to form the tubular element 38. In the present example, first and second paper layers are provided in a two-ply tube, although in other examples 3, 4 or more paper layers can be used forming 3, 4 or more ply tubes. Other constructions can be used, such as spirally wound layers of paper, cardboard tubes, tubes formed using a papier-mâché type process, molded or extruded plastic tubes or similar. The second hollow tubular element 38 can also be formed using a stiff plug wrap and/or tipping paper as the second plug wrap 39 and/or tipping paper 35 described herein, meaning that a separate tubular element is not required.

The second hollow tubular element 38 is located around and defines an air gap within the mouthpiece 31 which acts as a cooling segment. The air gap provides a chamber through which heated volatilized components generated by the aerosol generating material 33 may flow. The second hollow tubular element 38 is hollow to provide a chamber for aerosol accumulation yet rigid enough to withstand axial compressive forces and bending moments that might arise during manufacture and whilst the article 21 is in use. The second hollow tubular element 38 provides a physical displacement between the aerosol generating material 33 and the body of material 36. The physical displacement provided by the second hollow tubular element 38 will provide a thermal gradient across the length of the second hollow tubular element 38.

Of course, the article 30 is provided by way of example only. The skilled person will be aware of many alternative arrangements of such an article that could be used in the systems described herein.

Figure 5:
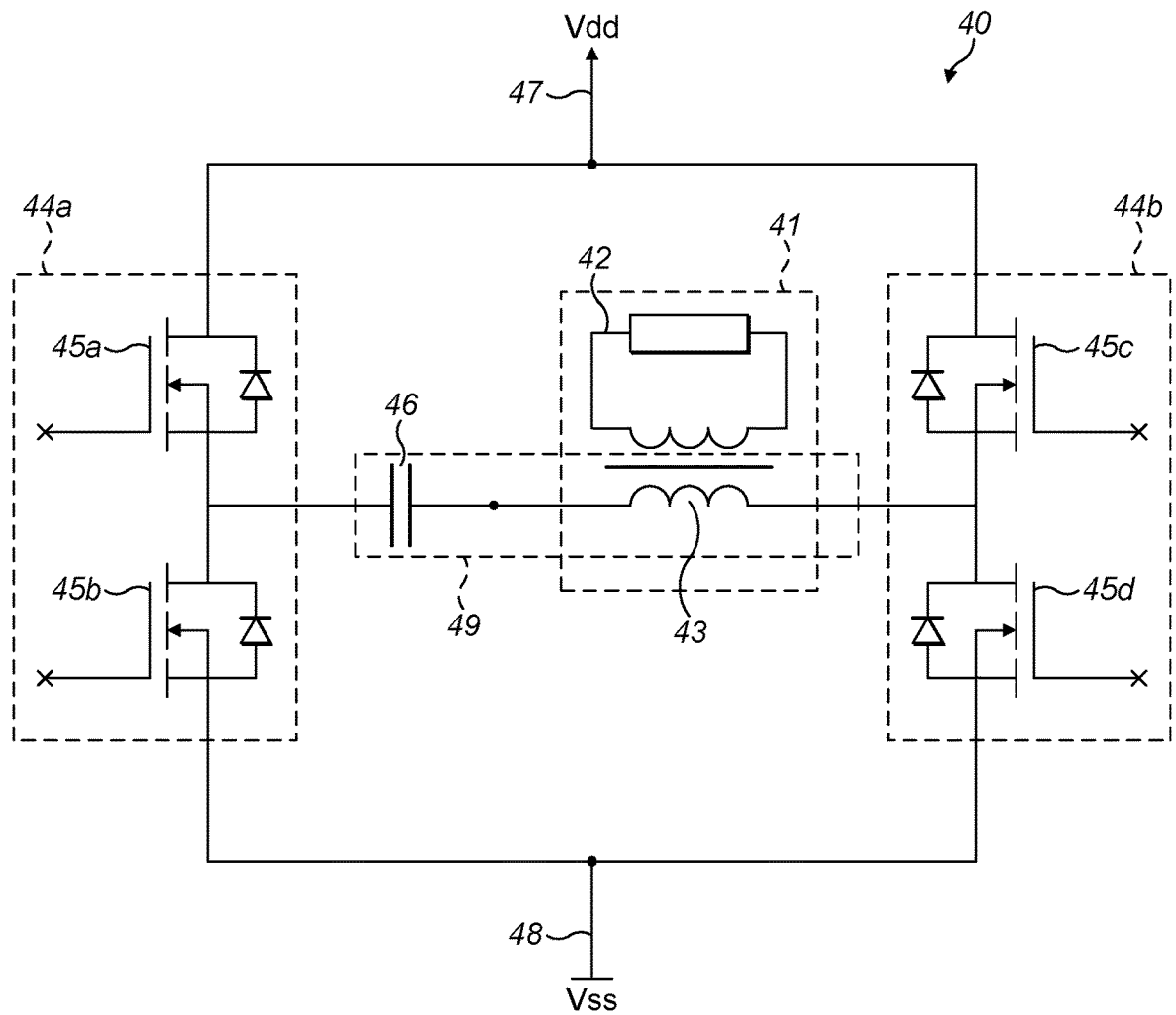
FIG. 5 is a block diagram of a circuit in accordance with an example embodiment.

FIG. 5 is a block diagram of a circuit, indicated generally by the reference numeral 40, in accordance with an example embodiment. The circuit 40 comprises a positive terminal 47 and a negative (ground) terminal 48 (that are an example implementation of the DC voltage supply 11 of the system 10 described above). The circuit 40 comprises a switching arrangement 44 (implementing the switching arrangement 13 described above), where the switching arrangement 44 comprises a bridge circuit (e.g. an H-bridge circuit, such as an FET H-bridge circuit). The switching arrangement 44 comprises a first circuit branch 44a and a second circuit branch 44b, where the first circuit branch 44a and the second circuit branch 44b may be coupled by a resonant circuit 49 (implementing the resonant circuit 14 described above). The first circuit branch 44a comprises switches 45a and 45b, and the second circuit branch 44b comprises switches 45c and 45d. The switches 45a, 45b, 45c, and 45d may be transistors, such as field-effect transistors (FETs), and may receive inputs from a controller, such as the control circuit 18 of the system 10. The resonant circuit 49 comprises a capacitor 46 and an inductive element 43 such that the resonant circuit 49 may be an LC resonant circuit. The circuit 40 further shows a susceptor equivalent circuit 42 (thereby implementing the susceptor arrangement 16). The susceptor equivalent circuit 42 comprises a resistance and an inductive element that indicate the electrical effect of an example susceptor arrangement 16. When a susceptor is present, the susceptor arrangement 42 and the inductive element 43 may act as a transformer 41. Transformer 41 may produce a varying magnetic field such that the susceptor is heated when the circuit 40 receives power. During a heating operation, in which the susceptor arrangement 16 is heated by the inductive arrangement, the switching arrangement 44 is driven (e.g., by control circuit 18) such that each of the first and second branches are coupled in turn such that an alternating current is passed through the resonant circuit 14. The resonant circuit 14 will have a resonant frequency, which is based in part on the susceptor arrangement 16, and the control circuit 18 may be configured to control the switching arrangement 44 to switch at the resonance frequency or a frequency close to the resonant frequency. Driving the switching circuit at or close to resonance helps improve efficiency and reduces the energy being lost to the switching elements (which causes unnecessary heating of the switching elements). In an example in which the article 21 comprising an aluminum foil is to be heated, the switching arrangement 44 may be driven at a frequency of around 2.5 MHz. However, in other implementations, the frequency may, for example, be anywhere between 500 kHz to 4 MHz.

A susceptor is a material that is heatable by penetration with a varying magnetic field, such as an alternating magnetic field. The heating material may be an electrically-conductive material, so that penetration thereof with a varying magnetic field causes induction heating of the heating material. The heating material may be magnetic material, so that penetration thereof with a varying magnetic field causes magnetic hysteresis heating of the heating material. The heating material may be both electrically-conductive and magnetic, so that the heating material is heatable by both heating mechanisms.

Induction heating is a process in which an electrically-conductive object is heated by penetrating the object with a varying magnetic field. The process is described by Faraday's law of induction and Ohm's law. An induction heater may comprise an electromagnet and a device for passing a varying electrical current, such as an alternating current, through the electromagnet. When the electromagnet and the object to be heated are suitably relatively positioned so that the resultant varying magnetic field produced by the electromagnet penetrates the object, one or more eddy currents are generated inside the object. The object has a resistance to the flow of electrical currents. Therefore, when such eddy currents are generated in the object, their flow against the electrical resistance of the object causes the object to be heated. This process is called Joule, ohmic, or resistive heating. An object that is capable of being inductively heated is known as a susceptor.

In one embodiment, the susceptor is in the form of a closed circuit. It has been found in some embodiments that, when the susceptor is in the form of a closed circuit, magnetic coupling between the susceptor and the electromagnet in use is enhanced, which results in greater or improved Joule heating.

Magnetic hysteresis heating is a process in which an object made of a magnetic material is heated by penetrating the object with a varying magnetic field. A magnetic material can be considered to comprise many atomic-scale magnets, or magnetic dipoles. When a magnetic field penetrates such material, the magnetic dipoles align with the magnetic field. Therefore, when a varying magnetic field, such as an alternating magnetic field, for example as produced by an electromagnet, penetrates the magnetic material, the orientation of the magnetic dipoles changes with the varying applied magnetic field. Such magnetic dipole reorientation causes heat to be generated in the magnetic material.

When an object is both electrically-conductive and magnetic, penetrating the object with a varying magnetic field can cause both Joule heating and magnetic hysteresis heating in the object. Moreover, the use of magnetic material can strengthen the magnetic field, which can intensify the Joule heating.

In each of the above processes, as heat is generated inside the object itself, rather than by an external heat source by heat conduction, a rapid temperature rise in the object and more uniform heat distribution can be achieved, particularly through selection of suitable object material and geometry, and suitable varying magnetic field magnitude and orientation relative to the object. Moreover, as induction heating and magnetic hysteresis heating do not require a physical connection to be provided between the source of the varying magnetic field and the object, design freedom and control over the heating profile may be greater, and cost may be lower.

Figure 6:
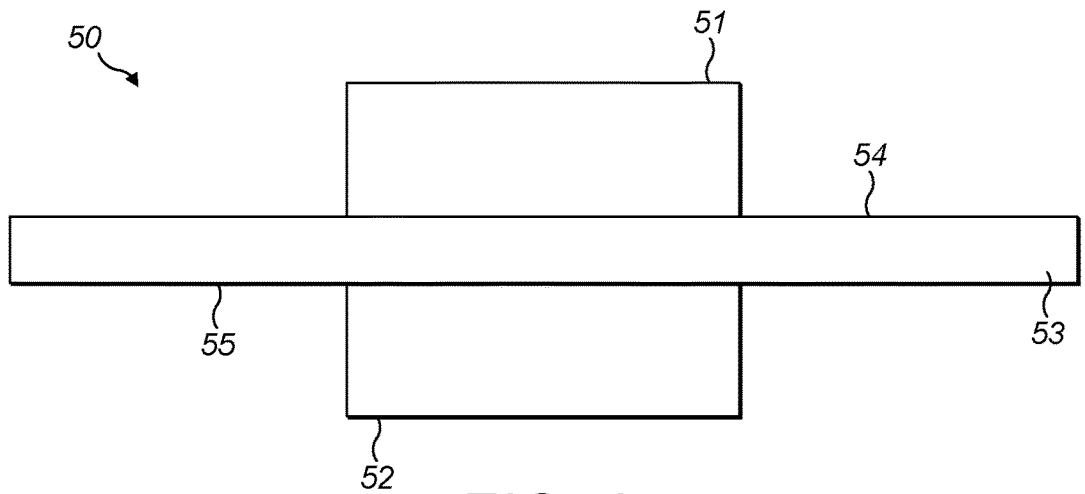
FIGS. 6 to 15 are block diagrams of systems in accordance with example embodiments.

FIG. 6 is a block diagram of a system, indicated generally by the reference numeral 50, in accordance with an example embodiment. System 50 comprises a resonant circuit 51 (similar to the resonant circuit 14), a switching arrangement 52 (similar to the switching arrangement 13), and a substrate 53. As discussed above with respect to FIG. 5, the resonant circuit 51 may comprise one or more inductive elements and the switching arrangement 52 may comprise a plurality of transistors. The one or more inductive elements may be mounted on a first external surface 54 of the substrate 53. The plurality of transistors may be mounted on a second external surface 55 of the substrate 53. The substrate 53 may be a printed circuit board (PCB). The resonant circuit 51 may include a capacitor although, as noted below, the capacitor may be provided elsewhere in the system 50.

The resonant circuit 51 and the switching arrangement 52 may generate heat that may cause the overall temperature of the system 50 to rise. It may be beneficial to mount the resonant circuit 51 (or at least one or more inductive elements thereof) on the first surface 54, and the switching arrangement 52 on the second surface 55, so that the resonant circuit 51 and the switching arrangement 52 may, at least partially, be thermally isolated from each other by the substrate 53.

Figure 7:
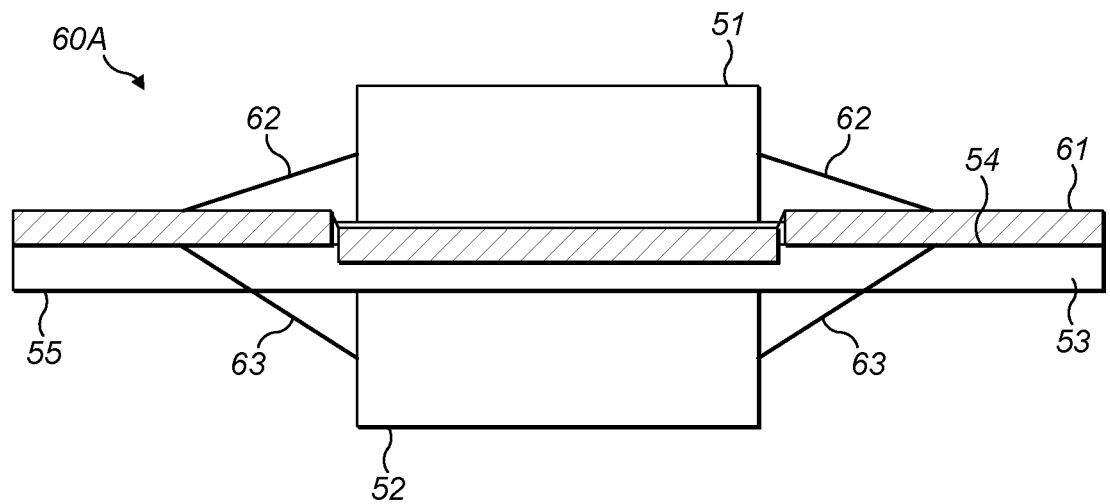

FIG. 7 is a block diagram of a system, indicated generally by the reference numeral 60A, in accordance with an example embodiment. System 60A (showing a cross-section) comprises the substrate 53, one or more inductive elements of the resonant circuit 51 mounted on the first external surface 54 of the substrate 53, the plurality of transistors of the switching arrangement 52 mounted on the second external surface 55 of the substrate 53, and a heat sink 61. The one or more inductive elements of the resonant circuit 51 are thermally connected to the heat sink 61 via connections 62, and the plurality of transistors of the switching arrangement 52 are thermally connected to the heat sink 61 via connections 63.

In an example embodiment, the switching arrangement 52 may be implemented using one or more integrated circuits. The integrated circuits may be provided within a protective material (such as plastic) which provides some protection against damage due to handling or the like to the integrated circuits. Such arrangements are typically known as packages (or sometimes electrical packages). While packages offer protection to the integrated circuitry embedded within (or covered by) the protective material, heat dissipation can be negatively impacted. The plurality of transistors of the switching arrangement 52 may be implemented using one or more flat no-lead packages. The flat no-lead packages may be dual-flat no-leads (DFN) packages, quad-flat no-leads (QFN) packages or similar packages.

Use of DFN or QFN packages may enable improved heat dissipation from the switching arrangement 52 to the substrate 53 on which substrate 53 the DFN/QFN packages may be mounted. DFN and QFN packages typically include an exposed thermal pad (that is, an element, such as a metallic element, which has at least one exposed surface that is not covered by the protective material), which can improve heat dissipation. The improved heat dissipation may enable the switching arrangement 52 to be run at loads generating greater heat than would be achievable using other forms of integrated circuits that do not use DFN or QFN packages.

The heat sink 61 may provide increased heat dissipation, and thereby may allow maintaining the temperature of the printed circuit board below a threshold temperature. The heat sink 61 may be formed on the first external surface 54 of the substrate 53. The heat sink 61 (and other heat sinks described herein) may, for example, be in the form of a copper mass (e.g. a copper plane) to absorb, spread and dissipate heat. The skilled person will be aware of alternative arrangements.

The heat sink 61 may be arranged such that the resonant circuit 51 may only be thermally connected to the heat sink 61 via connections 62. As such, the remaining surface of the heat sink 61 may be isolated from the surface of the resonant circuit 51 with a fluid, such as air, or any other cooling medium.

In implementations where the switching arrangement 52 is implemented using one or more flat no-lead packages, the connections 63 may run from the thermal pad to the heat sink 61. The connections 63 may pass through the substrate 63, for example, in the form of vias.

Figure 8:
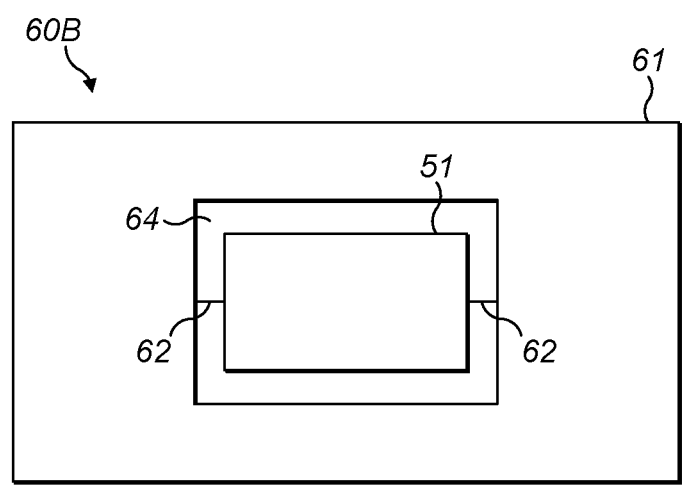

FIG. 8 is a top-view, indicated generally by the reference numeral 60B, of the system 60A, in accordance with an example embodiment. As illustrated in the top view 60B, the heat sink 61 and the resonant circuit 51 (or at least the inductive element(s) thereof) may be isolated by a gap 64 or other electrically insulating material, for example to prevent short-circuits.

Figure 9:
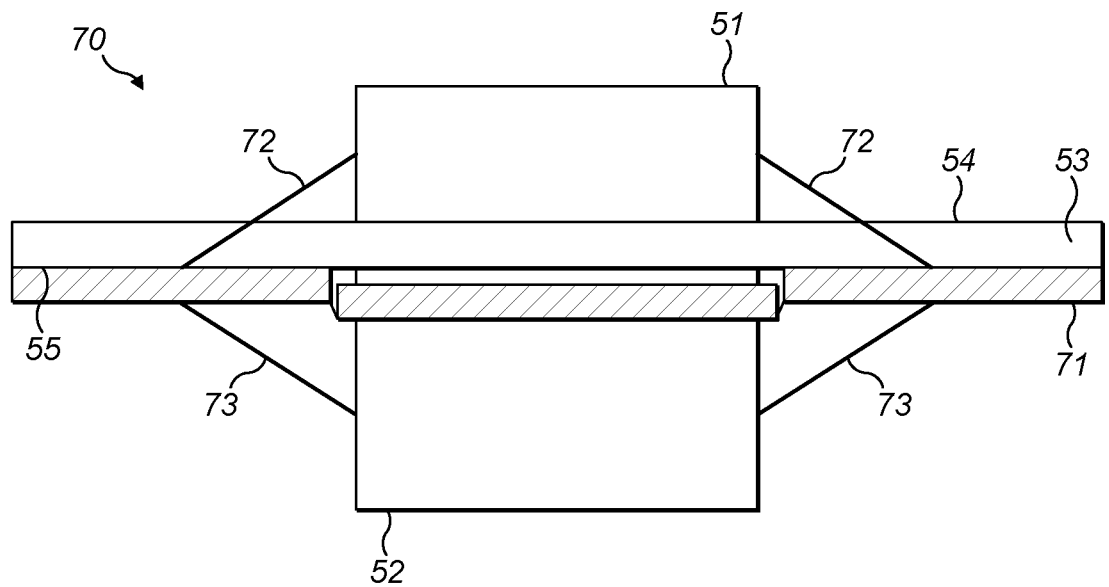

FIG. 9 is a block diagram of a system, indicated generally by the reference numeral 70, in accordance with an example embodiment. System 70 comprises the substrate 53, one or more inductive elements of the resonant circuit 51 mounted on the first external surface 54 of the substrate 53, the plurality of transistors of the switching arrangement 52 mounted on the second external surface 55 of the substrate 53, and a heat sink 71. The one or more inductive elements of the resonant circuit 51 are thermally connected to the heat sink 71 via connections 72, and the plurality of transistors of the switching arrangement 52 are thermally connected to the heat sink 71 via connections 73. The heat sink 71 may be formed on the second external surface 55 of the substrate 53.

The heat sink 71 may be arranged such that the switching arrangement 52 may only be thermally connected to the heat sink 71 via connections 73. As such, the remaining surface of the heat sink 71 may be isolated from the surface of the switching arrangement 52 with a fluid, such as air, or any other cooling medium.

In implementations where the switching arrangement 52 is implemented using one or more flat no-lead packages, the thermal pad may be directly connected to the heat sink 71. The thermal pad is electrically isolated from the integrated circuit.

Figure 10:
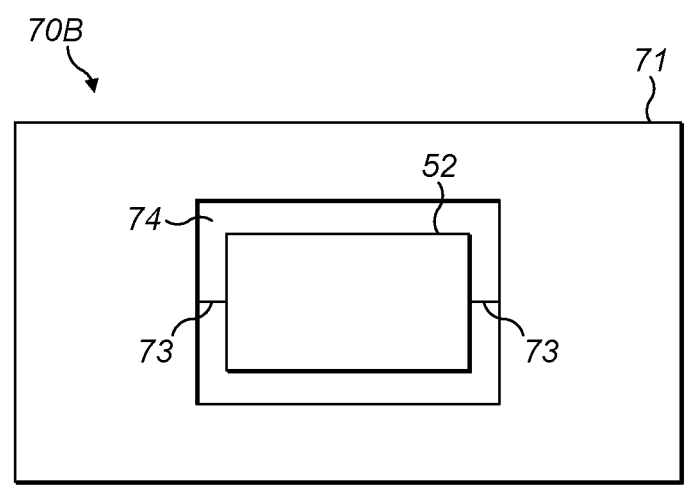

FIG. 10 is a bottom view, indicated generally by the reference numeral 70B, of the system 70A, in accordance with an example embodiment. As illustrated in the bottom view 70B, the heat sink 71 and the switching arrangement 52 may be isolated by a gap 74 or other electrically insulating material, for example to prevent short-circuits.

In an example embodiment, the heat sinks 61 and/or 71 may be a copper heat reservoir. Alternatively, the heat sinks 61 and/or 71 may be an aluminum heat reservoir. In an example embodiment, the heat sinks 61 and/or 71 may be a ground plane.

A heat sink, such as heat sinks 61 and 71, transfers thermal energy from a higher temperature device to a lower temperature fluid medium. The fluid medium is frequently air, but can also be water, refrigerants or oil. If the fluid medium is water, the heat sink is frequently called a cold plate. The heat sink may be a heat reservoir that can absorb an arbitrary amount of heat without significantly changing temperature.

Figure 11:
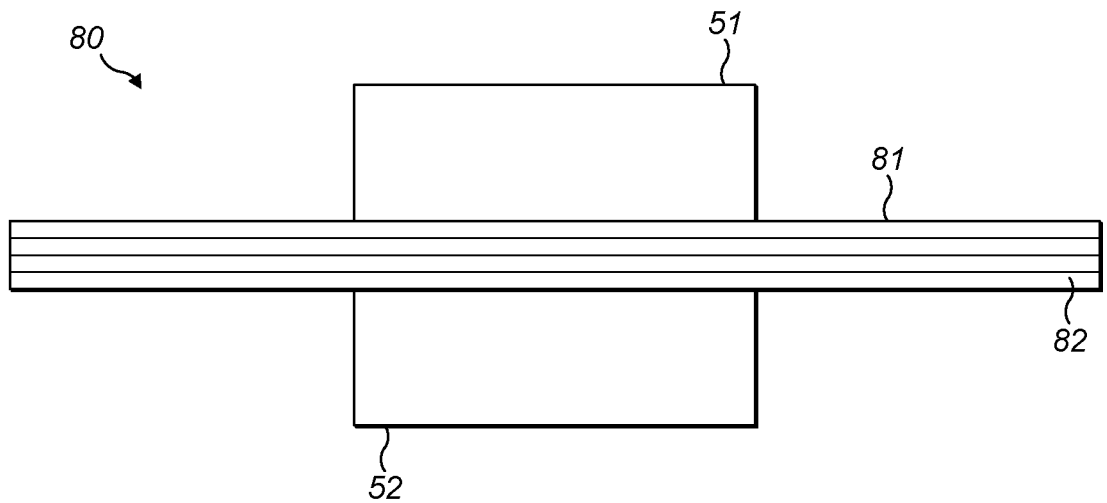

FIG. 11 is a block diagram of a system, indicated generally by the reference numeral 80, in accordance with an example embodiment. System 80 comprises the resonant circuit 51, the switching arrangement 52, and a substrate 81. The substrate 81 may be a printed circuit board. The printed circuit board may be a multi-layered printed circuit board comprising a plurality of layers 82.

Figure 12:
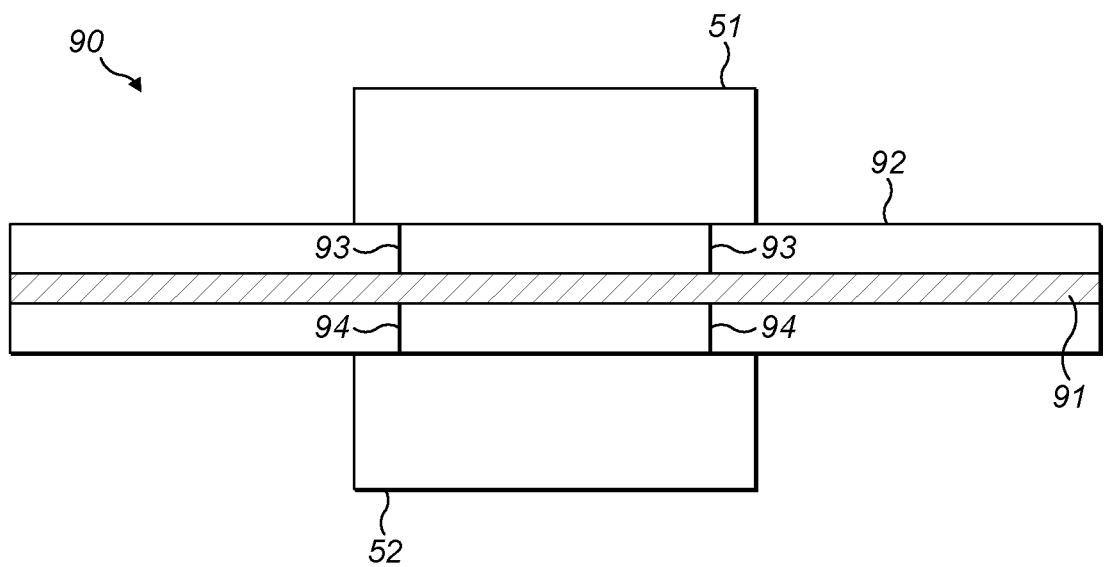

FIG. 12 is a block diagram of a system, indicated generally by the reference numeral 90, in accordance with an example embodiment. System 90 comprises the resonant circuit 51, the switching arrangement 52, a substrate 92, and a heat sink 91. The substrate 92 may be a multi-layered printed circuit board. The heat sink 91 may be formed, at least in part, on an internal layer of the substrate 92, which substrate 92 is a multi-layered printed circuit board. The resonant circuit 51 may be thermally connected to the heat sink 91 via connections 93, and the switching arrangement 52 may be thermally connected to the heat sink 91 via the connections 94.

Figure 13:
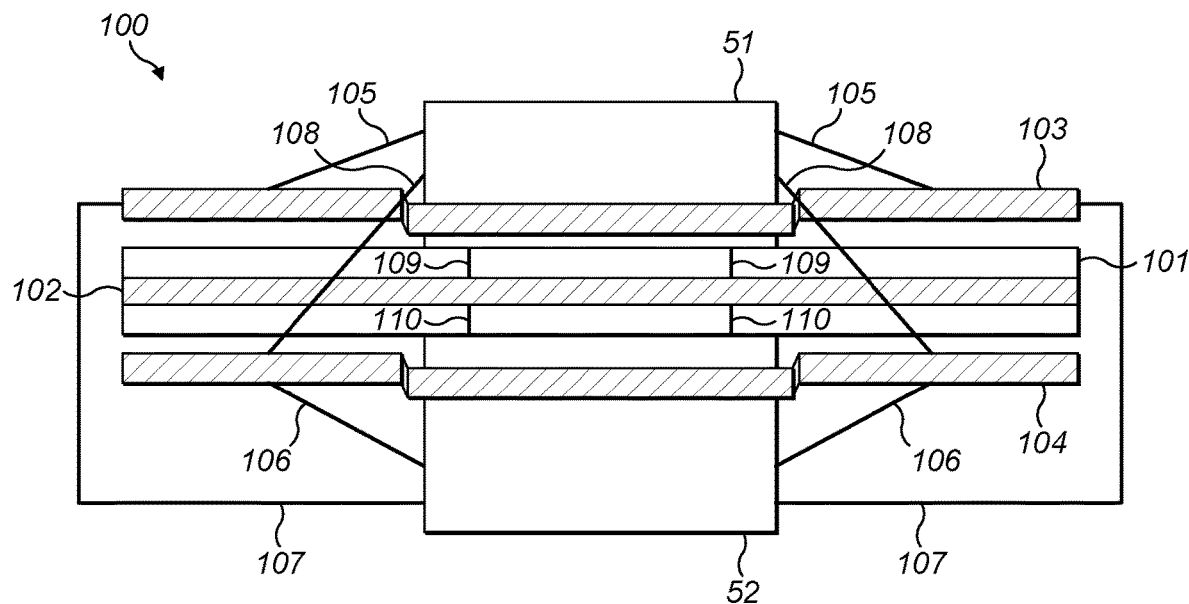

FIG. 13 is a block diagram of a system, indicated generally by the reference numeral 100, in accordance with an example embodiment. System 100 comprises the resonant circuit 51, the switching arrangement 52, a substrate 101, and a plurality of layers 102, 103, and 104. The layers include a layer 103 formed on a first external surface of the substrate 101, a layer 102 formed on an internal layer of the substrate 101, and a layer 104 formed on a second external surface of the substrate 101. One of more of said layers 102 to 104 could be used as a heat sink. Moreover, one or more of said layers could be used for some other purpose (e.g. routing of electrical signals).

By way of example, the resonant circuit 51 may be thermally and or electrically connected to one or more of the layers 102 to 104 (for example via connections 109, 105 and 108 respectively). Similarly, the switching arrangement 52 may be thermally or electrically connected to one or more of the layers 102 to 104 (for example via connections 110, 107 and 106 respectively).

Figure 14:
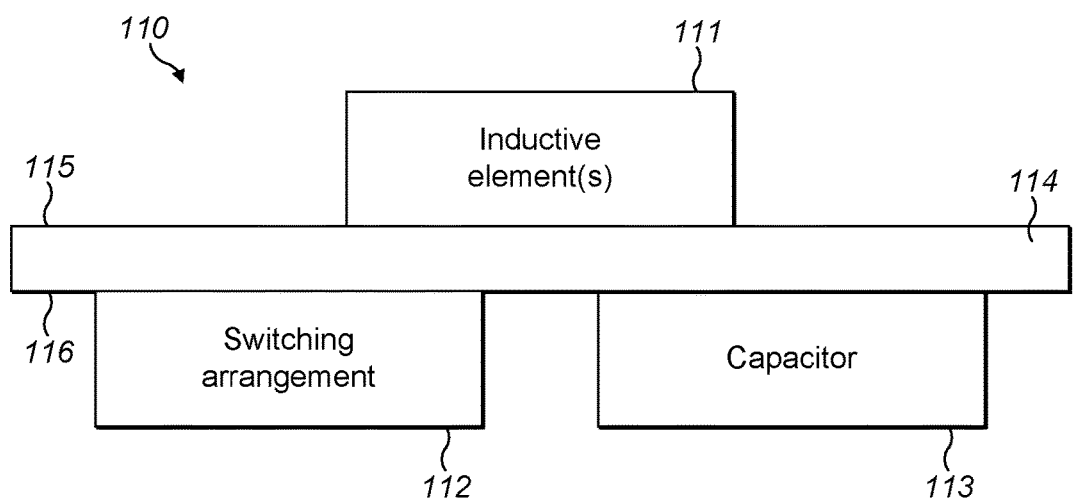

In some of the example arrangements described above, a resonant circuit has been provided on a first external surface of a substrate (e.g. a printed circuited board) and a switching arrangement on a second external surface of the substrate, with the resonant circuit including one or more inductive elements and at least one capacitor. This is not essential to all embodiments. For example, FIG. 14 is a block diagram of a system, indicated generally by the reference numeral 110, comprising one or more inductive elements 111, a switching arrangement 112 and at least one capacitive element 113. The inductive element(s) and the capacitive element(s) form one or more resonant circuits. The one or more inductive elements are mounted on a first external surface 115 of a substrate 114. The switching arrangement (e.g. a plurality of transistors, as discussed above) is mounted on a second external surface 116 of the substrate 114. In the example system 110, the capacitor(s) are also mounted on the second external surface 116 of the substrate.

Figure 15:
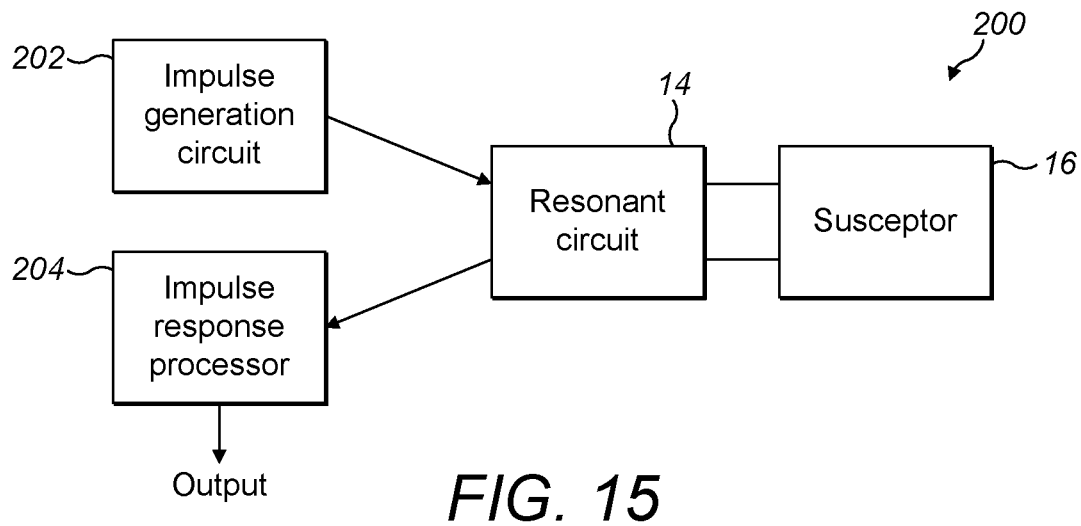

FIG. 15 is a block diagram of a system, indicated generally by the reference numeral 200, in accordance with an example embodiment. The system 200 comprises the resonant circuit 14 and the susceptor 16 of the system 10 described above. The system 200 further comprises an impulse generation circuit 202 and an impulse response processor 204. The impulse generation circuit 202 and the impulse response processor 204 may be implemented as part of the control circuit 18 of the system 10.

The impulse generation circuit 202 may be implemented using a first switching arrangement (such as an H-bridge circuit) to generate the impulse by switching between positive and negative voltage sources. For example, the switching arrangement 44 described above with reference to FIG. 5 may be used. As described further below, the impulse generation circuit 202 may generate an impulse by changing the switching states of the FETs of the switching arrangement 44 from a condition where the switches 45b and 45d are both on (such that the switching arrangement is grounded) and the switches 45a and 45b are off, to a state where the switch states of one of the first and second circuit branches 44a and 44b are reversed. The impulse generation circuit 202 may alternatively be provided using a pulse width modulation (PWM) circuit. Other impulse generation arrangements are also possible.

The impulse response processor 204 may determine one or more performance metrics (or characteristics) of the resonant circuit 14 and the susceptor 16 based on the impulse response. Such performance metrics include properties of an article (such as the removable article 21), presence or absence of such an article, type of article, temperature of operation etc.

Figure 16:
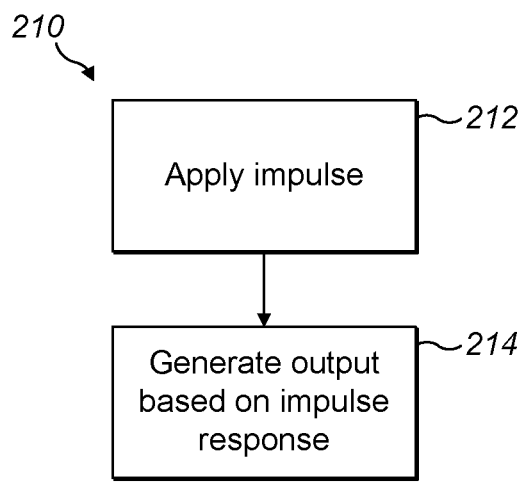
FIG. 16 is a flow chart showing an algorithm in accordance with an example embodiment.

FIG. 16 is a flow chart showing an algorithm, indicated generally by the reference numeral 210, in accordance with an example embodiment. The algorithm 210 shows an example use of the system 200.

Figure 17:
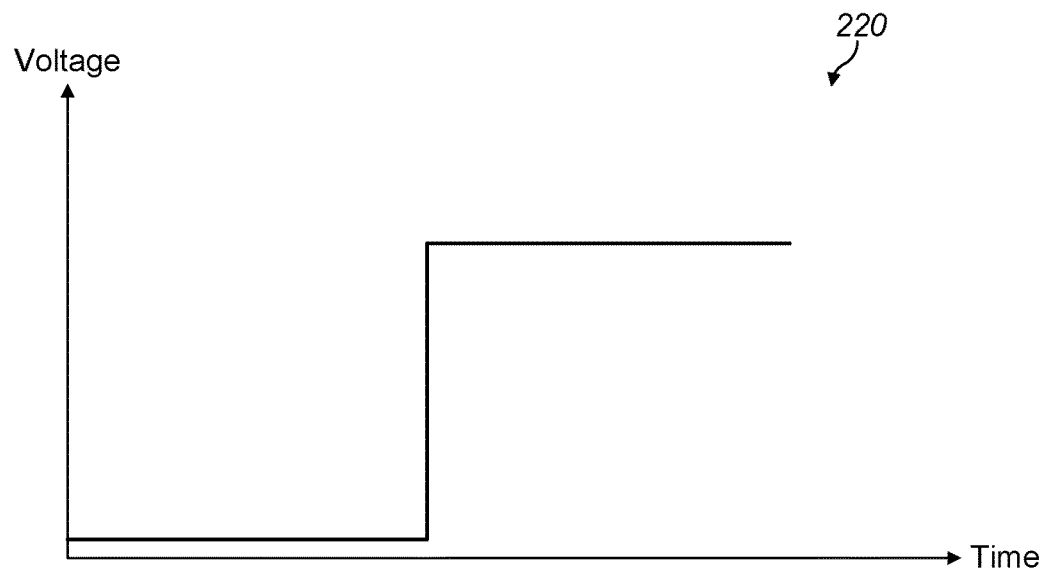
FIGS. 17 and 18 are plots demonstrating example uses of example embodiments.

The algorithm 210 starts at operation 212 where an impulse (generated by the impulse generation circuit 202) is applied to the resonant circuit 14. FIG. 17 is a plot, indicated generally by the reference numeral 220, showing an example impulse that might be applied in the operation 212.

The impulse may be applied to the resonant circuit 14. Alternatively, in systems having multiple inductive elements (such as non-combustible aerosol arrangement 20 described above with reference to FIGS. 2 and 3), the impulse generation circuit 202 may select one of a plurality of resonant circuits, each resonant circuit comprising an inductive element for inductively heating a susceptor and a capacitor, wherein the applied impulse induces an impulse response between the capacitor and the inductive element of the selected resonant circuit.

Figure 18:
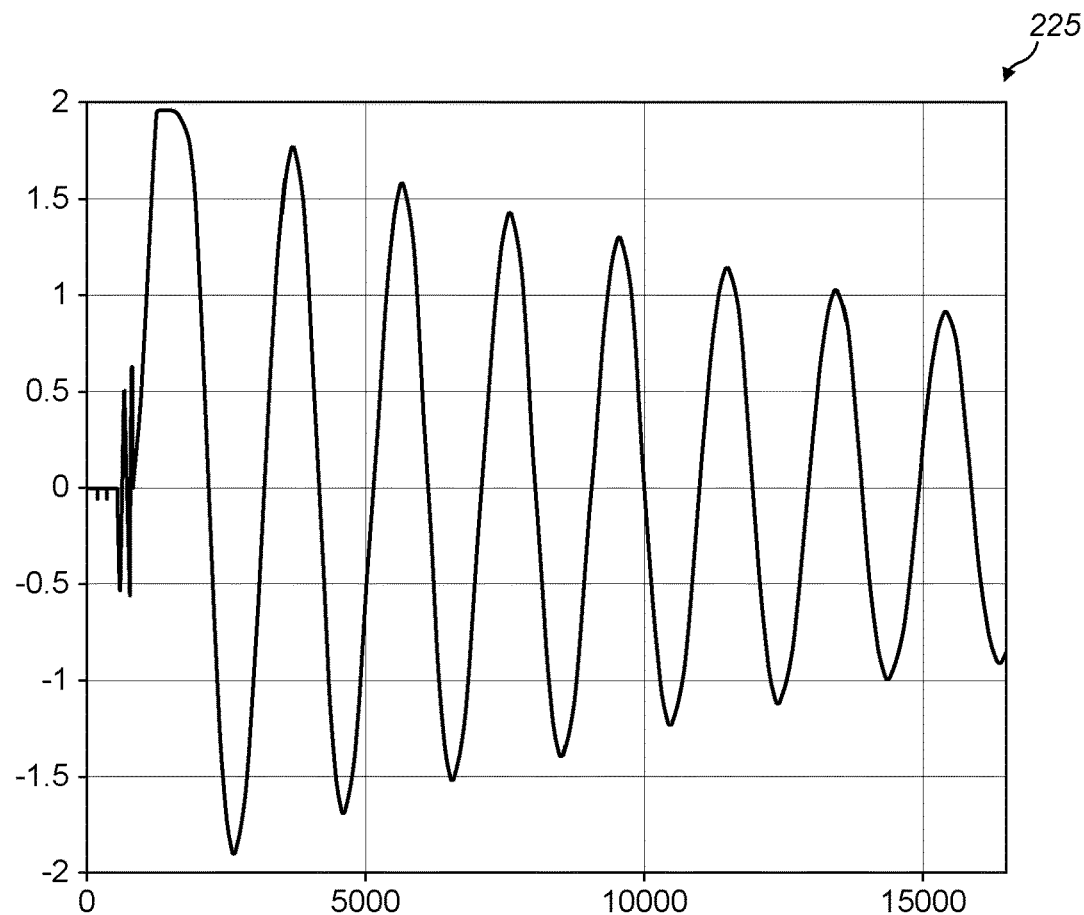

At operation 214, an output is generated (by the impulse response processor 204) based on an impulse response that is generated in response to the impulse applied in operation 212. FIG. 18 is a plot, indicated generally by the reference numeral 225, showing an example impulse response that might be received at the impulse response processor 204 is response to the impulse 220. As shown in FIG. 18, the impulse response may take the form of a ringing resonance. The impulse response is a result of charge bouncing between the inductor(s) and capacitor of the resonant circuit 14. In one arrangement, no heating of the susceptor is caused as a result. That is, the temperature of the susceptor remains substantially constant (e.g., within ±1° C. or ±0.1° C. of the temperature prior to applying the impulse).

At least some of the properties of the impulse response (such as frequency and/or decay rate of the impulse response) provide information regarding the system to which the impulse is applied. Thus, the system 200 can be used to determine one or more properties of the system to which the impulse is applied. For example one or more performance properties, such as fault conditions, properties of an inserted article 21, presence or absence of such an article, whether the article 21 is genuine, temperature of operation etc., can be determined based on output signal derived from an impulse response. The system 200 may use the determined one or more properties of the system to perform further actions (or prevent further actions if so desired) using the system 10, for example, to perform heating of the susceptor arrangement 16. For instance, based on the determined temperature of operation, the system 200 can choose what level of power is to be supplied to the induction arrangement to cause further heating of the susceptor arrangement, or whether power should be supplied at all. For some performance properties, such as fault conditions or determining whether the article 21 is genuine, a measured property of the system (as measured using the impulse response) can be compared to an expected value or range of values for the property, and actions taken by the system 200 are performed on the basis of the comparison.

Figure 19:
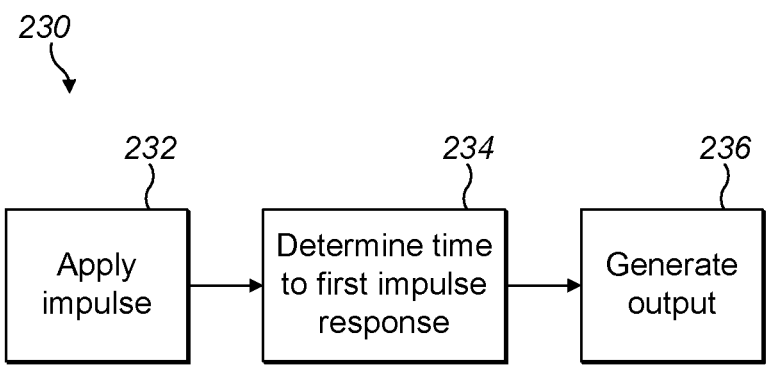
FIG. 19 is a flow chart showing an algorithm in accordance with an example embodiment.

FIG. 19 is a flow chart showing an algorithm, indicated generally by the reference numeral 230, in accordance with an example embodiment. At operation 232 of the algorithm 230, an impulse is applied to the resonant circuit 14 by the impulse generation circuit 202. Thus, the operation 232 is the same as the operation 212 described above.

At operation 234 of the algorithm 230, a period of an impulse response induced in response to the applied impulse is determined by the impulse response processor 204. Finally, at operation 236, an output is generated (based on the determined period of the impulse response).

Figure 20:
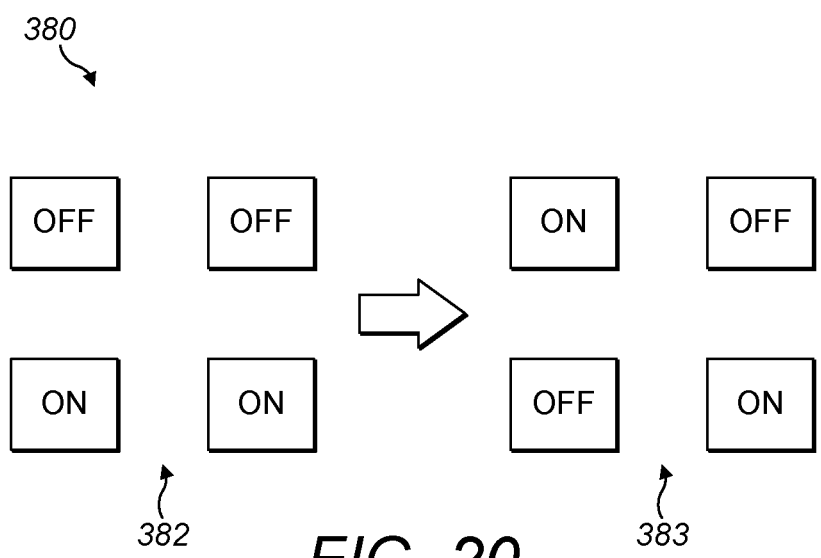
FIG. 20 is a block diagram of a circuit switching arrangement in accordance with an example embodiment.

FIG. 20 is a block diagram of a circuit switching arrangement, indicated generally by the reference numeral 380, in accordance with an example embodiment. The switching arrangement 380 shows switch positions of the circuit 40 in a first state, indicated generally by the reference numeral 382, and a second state, indicated generally by the reference numeral 383.

In the first state 382, the switches 45a and 45c of the circuit 40 are off (i.e. open) and the switches 45b and 45d are on (i.e. closed). In the second state 383, the switches 45a and 45d are on (i.e. closed) and the switches 45b and 45c are off. Thus, in the first state 382, both sides of the resonant circuit 49 are connected to ground. In the second state 383, a voltage pulse (i.e. an impulse) is applied to the resonant circuit.

Figure 21:
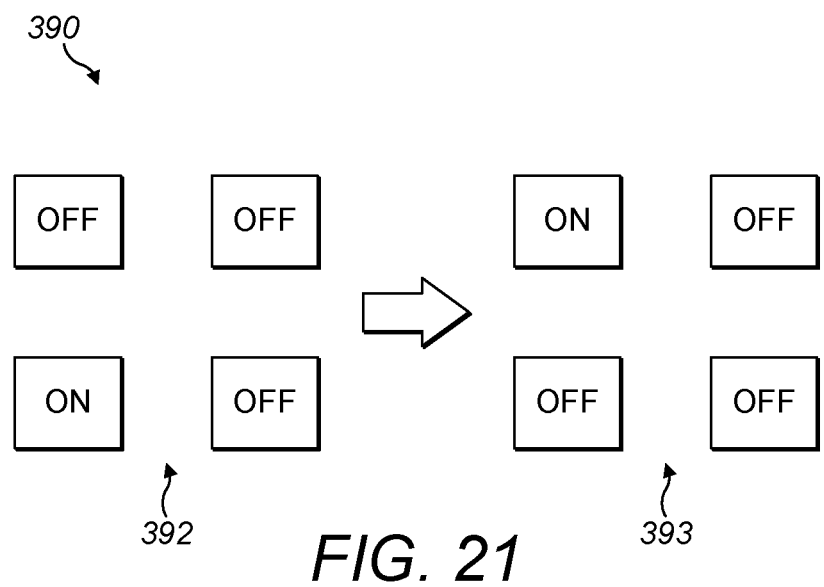
FIG. 21 is a block diagram of a circuit switching arrangement in accordance with an example embodiment.

FIG. 21 is a block diagram of a circuit switching arrangement, indicated generally by the reference numeral 390, in accordance with an example embodiment. The switching arrangement 390 shows switch positions of the circuit 40 in a first state, indicated generally by the reference numeral 392, and a second state, indicated generally by the reference numeral 393.

In the first state 392, the switch 45b is on (i.e. closed) and the switches 45a, 45c and 45d are off (i.e. open). Thus, one side of the resonant circuit 49 is grounded. In the second state 393, a voltage pulse (i.e. an impulse) is applied to the resonant circuit.

In the second state 382 of the switching arrangement 380, a current is able to flow through the first switch 45a, the resonant circuit 49 and the switch 45d. This current flow may lead to heat generation and discharging of a power supply (such as a battery). In the second state 393 of the switching arrangement 390, a current will not flow through the switch 45d. Accordingly, heat generation and power supply discharge may be reduced. Moreover, noise generation may be reduced on the generation of each impulse.

Figure 22:
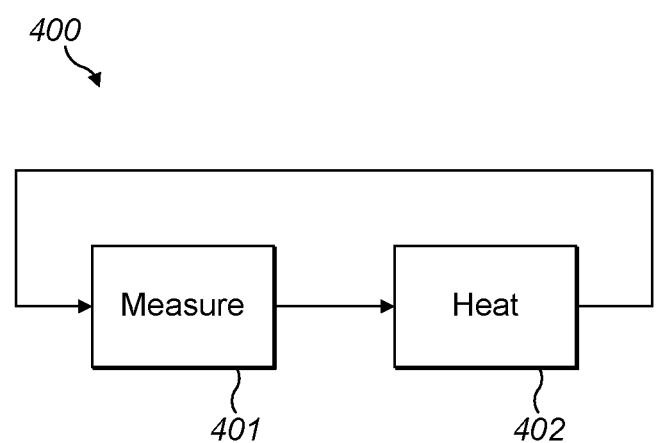
FIGS. 22 and 23 are flow charts showing algorithms in accordance with example embodiments.

FIG. 22 is a flow chart, indicated generally by the reference numeral 400, showing an algorithm in accordance with an example embodiment. The algorithm 400 shows an example use of the systems described herein.

The algorithm 400 starts with a measurement operation 401. The measurement operation 401 may, for example, include a temperature measurement. Next, at operation 402, a heating operation is carried out. The implementation of the heating operation 402 may be dependent on the output of the measurement operation 401. Once the heating operation 402 is complete, the algorithm 400 returns to operation 401, where the measurement operation is repeated.

The operation 401 may be implemented by the system 200 in which an impulse is applied by the impulse generation circuit 202 and a measurement (e.g. a temperature measurement) determined based on the output of the impulse response processor 204. As discussed above, a temperature measurement may be based, for example, on a decay rate, an impulse response time, an impulse response period etc.

The operation 402 may be implemented by controlling the inductive heating arrangement 12 in order to heat the susceptor 16 of the system 10. The inductive heating arrangement 12 may be driven at or close to the resonant frequency of the resonant circuit, in order to cause an efficient heating process. The resonant frequency may be determined based on the output of the operation 401.

In one implementation of the algorithm 400, the measurement operation is conducted for a first period of time, the heating operation 402 is conducted for a second period of time and the process is then repeated. For example, the first period of time may be 10 ms and the second period of time may be 250 ms, although other time periods are possible. In other words, the measurement operation may be performed between successive heating operations. It should also be noted that the heating operation 402 being conducted for the second period of time does not necessarily imply that power is supplied to the induction coil for the whole duration of the second period of time. For example, power may only be supplied for a fraction of the second period of time.

In an alternative embodiment, the algorithm 400 may be implemented with the heating operation 402 having a duration dependent on a required level of heating (with the heating duration being increased if more heating is required and reduced if less heating is required). In such an algorithm, the measurement operation 401 may simply be carried out when heating is not being conducted, such that the heating operation 402 need not be interrupted in order to conduct the measurement operation 401. This interleaved heating arrangement may be referred to as a pulse-width-modulation approach to heating control. By way of example, a pulse-width modulation scheme may be provided at a frequency of the order of 100 Hz, where each period is divided into a heating portion (of variable length) and a measurement portion.

Figure 23:
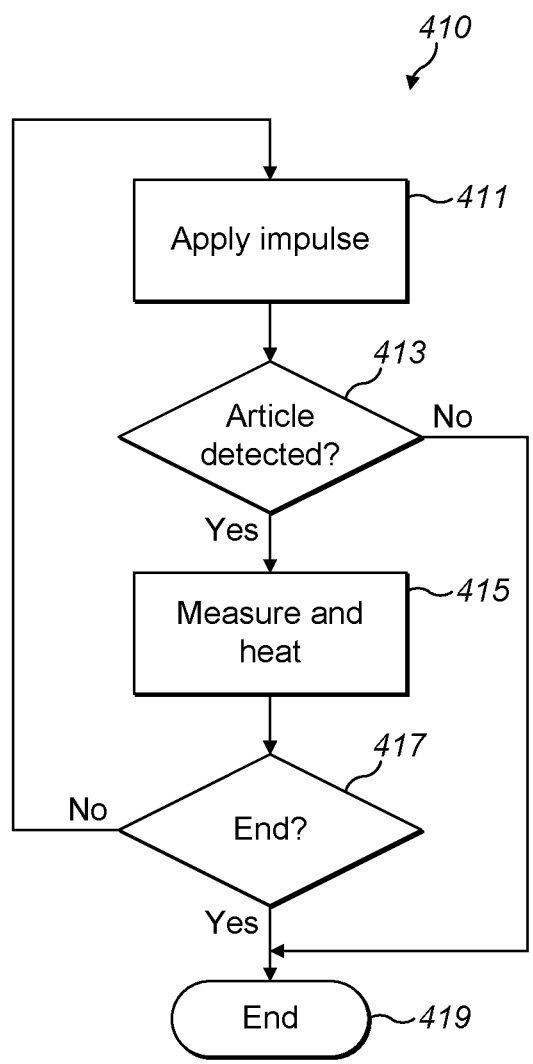

FIG. 23 is a flow chart, indicated generally by the reference numeral 410, showing an algorithm in accordance with an example embodiment. The algorithm 410 may be implemented using the system 200 described above.

The algorithm 410 starts at operation 411, where an impulse is applied to the resonant circuit 14 by the switching circuit 13 (e.g. the circuit 40). At operation 413, an impulse response (e.g. detected using the impulse response processor 204) is used to determine whether an article (such as the article 21) is present in the system to be heated. As discussed above, the presence of the article 21 affects the impulse response in a manner that can be detected.

If an article is detected at operation 413, the algorithm 410 moves to operation 415; otherwise, the algorithm terminates at operation 419.

At operation 415, measurement and heating operations are implemented. By way of example, the operation 415 may be implemented using the algorithm 400 described above. Of course, alternative measurement and heating arrangements could be provided.

Once a number of heating measurement and heating cycles have been conducted, the algorithm 400 moves to operation 417, where it is determined whether heating should be stopped (e.g. if a heating period has expired, or in response to a user input). If so, the algorithm terminates at operation 419; otherwise the algorithm 400 returns to operation 411.

It should be appreciated that the above techniques for determining one or more properties of the inductive arrangement or susceptor arrangement can be applied to individual inductive elements. For systems that comprise multiple inductive elements, such as the system 20, which comprises three inductive elements 23a, 23b, and 23c, the system may be configured such that the one or more parameters, such as the temperature, can be determined for each of the inductive elements using the above described techniques. In some implementations, it may be beneficial for the system to operate using separate measurements for each of the inductive elements. In other implementations, it may be beneficial for the system to operate using only a single measurement for the plurality of inductive elements (e.g., in the case of determining whether the article 21 is present or not). In such situations, the system may be configured to determine an average measurement corresponding to the measurements obtained from each inductive element. In other instances, only one of the plurality of inductive elements may be used to determine the one or more properties.

The various embodiments described herein are presented only to assist in understanding and teaching the claimed features. These embodiments are provided as a representative sample of embodiments only, and are not exhaustive and/or exclusive. It is to be understood that advantages, embodiments, examples, functions, features, structures, and/or other aspects described herein are not to be considered limitations on the scope of the invention as defined by the claims or limitations on equivalents to the claims, and that other embodiments may be utilized and modifications may be made without departing from the scope of the claimed invention. Various embodiments of the invention may suitably comprise, consist of, or consist essentially of, appropriate combinations of the disclosed elements, components, features, parts, steps, means, etc, other than those specifically described herein. In addition, this disclosure may include other inventions not presently claimed, but which may be claimed in future.

The invention claimed is:

1. An apparatus for an aerosol generating device comprising:
a resonant circuit comprising one or more inductive elements for inductively heating a susceptor arrangement to heat an aerosol generating material to thereby generate an aerosol, wherein the one or more inductive elements are mounted on a first external surface of a substrate;
a switching arrangement coupled to a voltage supply and configured to generate an alternating current at the tone or more inductive elements to cause inductive heating of the susceptor arrangement, wherein the switching arrangement comprises a plurality of transistors mounted to a second external surface of the substrate; and
a heat sink, wherein the heat sink is formed, at least in part, on the second external surface of the substrate, and wherein the inductive elements of the resonant circuit and the transistors of the switching arrangement are thermally connected to the heat sink.

2. The apparatus of claim 1, wherein the transistors of the switching arrangement are implemented using one or more flat no-lead packages.

3. The apparatus of claim 2, wherein the flat no-lead packages are dual-flat no-lead packages or quad flat no-lead packages.

4. The apparatus of claim 1, wherein the heat sink is formed, at least in part, on the first external surface of the substrate.

5. The apparatus of claim 1, wherein the heat sink is a copper heat reservoir.

6. The apparatus of claim 1, wherein the heat sink is a ground plane.

7. The apparatus of claim 1, wherein the substrate is a printed circuit board.

8. The apparatus of claim 7, wherein the printed circuit board is a multi-layered printed circuit board.

9. The apparatus of claim 8, wherein the heat sink is formed, at least in part, on an internal layer of the multi-layer printed circuit board.

10. The apparatus of claim 8, wherein the first external surface of the substrate is a top layer of said multi-layer printed circuit board and the second external surface of the substrate is a bottom layer of said multi-layer printed circuit board.

11. The apparatus of claim 1, wherein the switching arrangement comprises a bridge circuit.

12. The apparatus of claim 1, wherein said inductive elements are inductive coils.

13. The apparatus of claim 1, wherein the resonant circuit further comprises a capacitor.

14. The apparatus of claim 1, wherein the switching arrangement includes an impulse generation circuit configured to apply an impulse to the resonant circuit to induce an impulse response.

15. The apparatus of claim 1, wherein the voltage supply is a DC voltage supply.

16. A non-combustible aerosol generating device comprising:
an apparatus having:
a resonant circuit comprising one or more inductive elements for inductively heating a susceptor arrangement to heat an aerosol generating material to thereby generate an aerosol, wherein the one or more inductive elements are mounted on a first external surface of a substrate;
a switching arrangement coupled to a voltage supply and configured to generate an alternating current at the one or more inductive elements to cause inductive heating of the susceptor arrangement, wherein the switching arrangement comprises a plurality of transistors mounted to a second external surface of the substrate; and
a heat sink, wherein the heat sink is formed, at least in part, on the second external surface of the substrate, and wherein the inductive elements of the resonant circuit and the transistors of the switching arrangement are thermally connected to the heat sink.

17. The non-combustible aerosol generating device of claim 16, wherein the aerosol generating device is configured to receive a removable article comprising an aerosol generating material.

18. The non-combustible aerosol generating device of claim 17, wherein said aerosol generating material comprises an aerosol generating substrate and an aerosol forming material.

19. The non-combustible aerosol generating device of claim 17, wherein said removable article includes said susceptor arrangement.

20. The non-combustible aerosol generating device of claim 16, wherein the apparatus comprises a tobacco heating system.

* * * * *